United States Patent
De Santi et al.

(10) Patent No.: US 6,888,225 B2
(45) Date of Patent: May 3, 2005

(54) PROCESS OF FINAL PASSIVATION OF AN INTEGRATED CIRCUIT DEVICE

(75) Inventors: Giorgio De Santi, Milan (IT); Luca Zanotti, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/323,961

(22) Filed: Dec. 18, 2002

(65) Prior Publication Data

US 2003/0122221 A1 Jul. 3, 2003

Related U.S. Application Data

(60) Continuation of application No. 09/365,355, filed on Jul. 30, 1999, now abandoned, which is a division of application No. 09/060,192, filed on Apr. 14, 1998, now abandoned.

(30) Foreign Application Priority Data

Apr. 15, 1997 (EP) .............................................. 97830174

(51) Int. Cl.$^7$ .............................................. H01L 23/58
(52) U.S. Cl. ...................................... 257/639; 257/640
(58) Field of Search .................................. 257/626, 629, 257/632, 635, 639, 640, 649; 438/114, 465, 769, 724, 744, 757, 791, 954

(56) References Cited

U.S. PATENT DOCUMENTS

| | | | |
|---|---|---|---|
| 5,250,843 A | 10/1993 | Eichelberger | 257/692 |
| 5,605,867 A | 2/1997 | Sato et al. | 437/235 |
| 5,641,546 A | 6/1997 | Elwell et al. | 427/575 |
| 5,679,606 A | 10/1997 | Wang et al. | 438/763 |
| 5,750,211 A | 5/1998 | Weise et al. | 427/579 |
| 5,804,259 A | 9/1998 | Robles | 427/577 |
| 5,814,564 A | 9/1998 | Yao et al. | 438/723 |
| 6,117,345 A | 9/2000 | Liu et al. | 216/19 |
| 6,127,285 A | 10/2000 | Nag | 438/788 |

FOREIGN PATENT DOCUMENTS

| | | |
|---|---|---|
| EP | 0 611 129 A2 | 8/1994 |
| EP | 0 887 847 A1 | 12/1998 |
| JP | 06045313 | 2/1994 |

OTHER PUBLICATIONS

Pye, J.T. et al., "High-Density Plasma CVD and CMP for 0.25 $\mu$m Internetal Dielectric Processing," *Solid State Technology*, 38(12):65-71, Dec. 1995.

*Primary Examiner*—Hung Vu
(74) *Attorney, Agent, or Firm*—Lisa K. Jorgenson; E. Russell Tarleton; Seed IP Law Group PLLC

(57) ABSTRACT

A process for forming a final passivation layer over an integrated circuit comprises a step of forming, over a surface of the integrated circuit, a protective film by means of High-Density Plasma Chemical Vapor Deposition.

10 Claims, 2 Drawing Sheets

US 6,888,225 B2

PROCESS OF FINAL PASSIVATION OF AN INTEGRATED CIRCUIT DEVICE

This application is a Continuation of pending U.S. patent application No. 09/365,355, filed Jul. 30, 1999, now abandoned which is a Divisional of U.S. Applicant No. 09/060,192, filed Apr. 14, 1998 now abandoned.

TECHNICAL FIELD

The present invention relates to a process of forming final passivation of an integrated circuit device and a device made by said process.

BACKGROUND OF THE INVENTION

Semiconductor integrated circuits manufactured with Large Scale of Integration (LSI) technologies (LSI, VLSI, ULSI) require a protective layer against mechanical stress and aggressive chemical agents. This layer, generally called "passivation layer" is typically formed by silicon-based dielectrics, such as silicon dioxide (USG), phosphorus-doped or fluorurate-doped silicon oxide (PSG or FSG), silicon nitrides and nitride oxides ($Si_3N_4$, $SiO_xN$).

The passivation layer is conventionally formed by means of Chemical Vapor Deposition (CVD) techniques, either Plasma-Enhanced (PECVD) or at Atmospheric Pressure (APCVD).

Final passivation layers formed by means of the above-referred conventional techniques have up to now proved to be sufficiently satisfactory, and in view of the relatively low cost of both PECVD and APCVD manufacturing equipment their use has never been disputed.

On the other hand, a new CVD technique has been known for some years for the formation of Inter-Metal Dielectric (IMD) protective films in ULSI circuits. Such a technique, called High-Density Plasma CVD (HDPCVD), is substantially a combination of two simultaneous processes, i.e., deposition and sputtering.

The advantage of HDPCVD over known alternative IMD film formation processes (such as PECVD, APCVD or Spin-On-Glass (SOG) processes) is that this technique allows for better (complete) filling of gaps between metal lines, even for sub-micrometric intra-metal line distances, of the integrated circuit.

SUMMARY OF THE INVENTION

To resolve the difficulties of conventional techniques, an object of the present invention is to provide a new process of final passivation of integrated circuits by means of which final passivation layers having improved characteristics over conventionally-formed passivation layers can be formed, particularly suitable where the scale of integration of the integrated circuits is increased.

One embodiment of the present invention includes a method for forming a final passivation layer over an integrated circuit, characterized by comprising a step of forming, over a surface of the integrated circuit, a protective film by means of High-Density Plasma Chemical Vapor Deposition technique.

By applying the present invention, it is possible to form passivation layers with improved step coverage characteristics, even for extremely small geometries, for the integrated circuits. The resulting passivation layer of the integrated circuit does not depend, for example, on the distance between the metal lines of an upper metal layer of the integrated circuit even if such a distance is as low as approximately 0.2 $\mu$m. Additionally, the gaps between said metal lines are completely filled by the passivation layer.

Said protective film can be made of silicon dioxide, phosphorus-doped or fluorurate-doped silicon oxide, silicon nitrides or oxinitrides, and other suitable materials having a low dielectric constant.

The passivation layer may further comprise other films in addition to the one formed by means of HDPCVD. For example, these other films may be formed by means of PECVD or APCVD techniques. In this case, a first passivation film is formed over the surface of the integrated circuit to be protected by means of HDPCVD, thus filling completely the gaps between the metal lines defined in the uppermost metal layer of the integrated circuit. Over said first film, other passivation films are formed by means of conventional PECVD or APCVD techniques.

It has been realized and practically verified by Applicant that, notwithstanding the present common technical prejudice in favor of PECVD- or APCVD-formed final passivation layers, the conventional PECVD or APCVD techniques could no longer provide satisfactory results as the integration scale of integrated devices is increased and the present invention provides considerable advantages.

The features and advantages of the present invention will be made apparent from the following detailed description of a particular embodiment thereof, illustrated as a non-limiting example in annexed drawings.

DETAILED DESCRIPTION OF THE INVENTION

Figure 1:
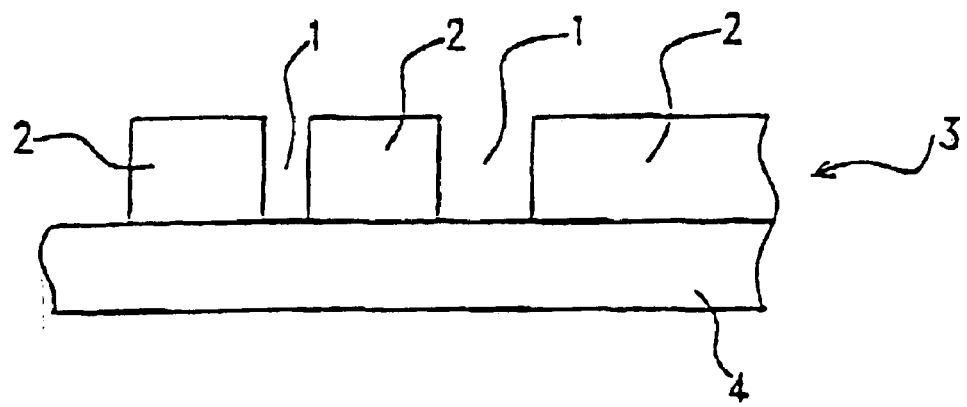
FIG. 1 is a schematic cross-sectional view of a portion of an integrated circuit before the formation of the final passivation layer.

In FIG. 1, a portion of an integrated circuit chip 3 is schematically shown in cross-section. The chip 3 generically comprises a substrate 4, over which, e.g., metal lines 2 are formed and between the metal lines 2, gaps 1 are formed. If the integrated circuit is fabricated by means of an Ultra Large Scale of Integration (ULSI) process, the gaps 1 can be as narrow as approximately 0.2 $\mu$m.

The integrated circuit chip 3 is to be protected by means of a final passivation layer.

According to an embodiment of the present invention, said final passivation layer is a dielectric layer of undoped silicon dioxide deposited over the surface of the integrated circuit chip 3 by means of High Density Plasma Chemical Vapor Deposition (HDPCVD). The chip (actually, the whole semiconductor wafer to which the chip belongs) is introduced in a CVD reaction chamber wherein the following process conditions are preferably provided:

$O_2$, $SiH_4$, Ar gas flow between 5–150 sccm, for each gas;
2000 to 4000 W source Radio-Frequency (RF) power;
a reaction chamber pressure of less than 10 mTorr; and
a 2.5:1 to 8.0:1 deposition/sputtering ratio.

Figure 2:
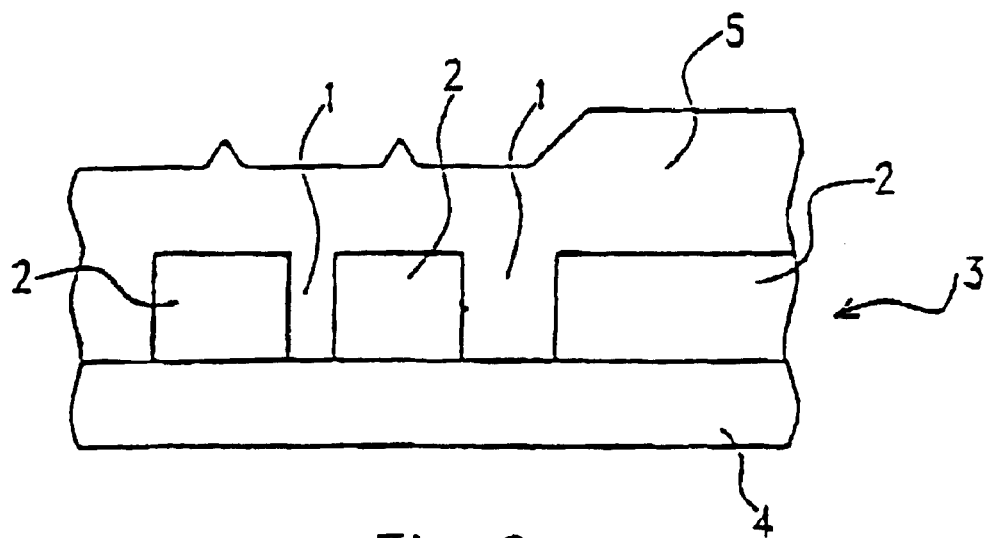
FIG. 2 shows the portion of integrated circuit of FIG. 1, after a final passivation layer has been formed by means of a process according to the invention.

At the end of this process, a passivation layer 5 covers the integrated circuit, as schematically shown in FIG. 2. It is to be noted that the passivation layer 5 completely fills the gaps 1 between the metal lines, even if such gaps are as narrow as approximately 0.2 μm.

Even if the above example has been referred to the formation of a silicon dioxide passivation layer, other materials, for example, phosphorus-doped or fluorurate-doped silicon oxide (PSG or FSG), silicon nitrides and nitride oxides ($Si_3N_4$, $SiO_xN_y$) can as well be deposited by means of HDPCVD.

Figure 3:
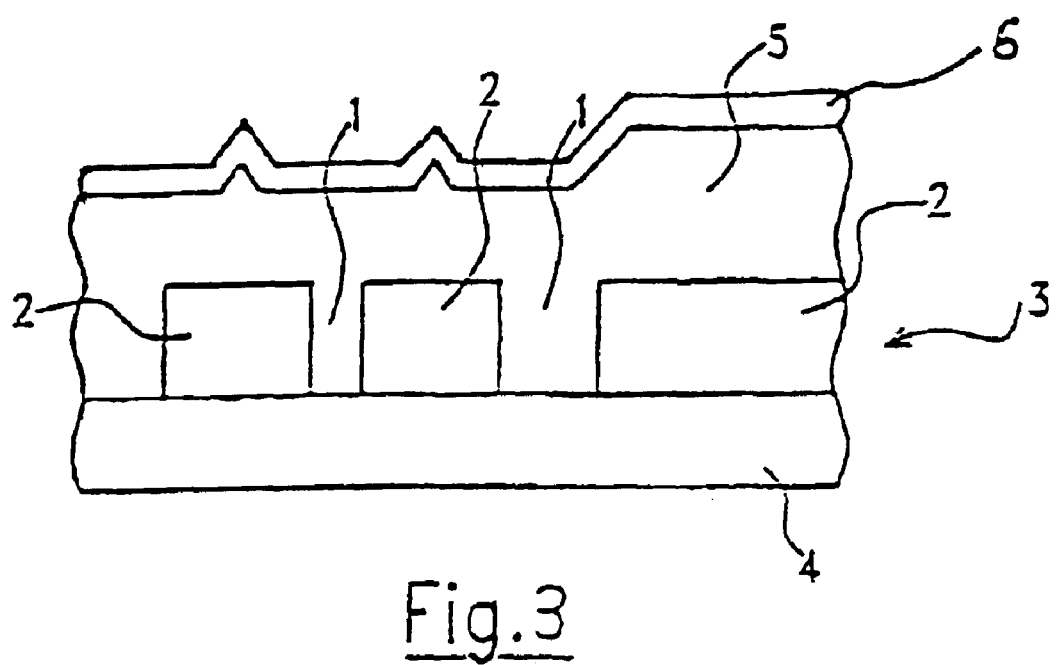
FIG. 3 shows an additional layer deposited over the passivation layer according to the invention.

In an alternative embodiment, the passivation layer could also comprise a stack of layers, the lowermost formed by means of HDPCVD technique, and the superimposed layers may be formed by conventional PECVD or APCVD techniques. In FIG. 3, an additional layer 6 formed by PECVD or APCVD is shown being superimposed over the passivation layer 5. In this way, the lowermost, HDPCVD deposited layer allows for a complete filling of the gaps.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit device, comprising a circuit having metal lines and gaps between the metal lines as narrow as 0.2 μm and a final passivation layer having only a first dielectric film and a second dielectric film, the first dielectric film formed of one of either HDPCVD silicon nitride and HDPCVD nitride oxide, to completely fill the gaps and the second dielectric film deposited directly in contact on all the surface of the first dielectric film.

2. The device of claim 1, wherein the second dielectric film consists of one of a Plasma-Enhanced CVD dielectric film and an Atmospheric Pressure CVD dielectric film.

3. An integrated circuit device, comprising:
an integrated circuit having metal lines and gaps between the metal lines that are as narrow as 0.2 μm; and
a final passivation layer having only a first dielectric film and a second dielectric film, the first dielectric film formed over said metal lines and gaps of one of either HDPCVD silicon nitride and HDPCVD nitride oxide completely filling the gaps between the metal lines, and the second dielectric film deposited directly in contact on all the surface of the first dielectric film and formed from one of a Plasma Enhanced CVD film and an Atmospheric Pressure CVD film.

4. The device of claim 3 wherein the first dielectric film is deposited in a reaction chamber and formed from a mixture of a dielectric material gas and an inert gas.

5. The device of claim 4 wherein the dielectric material gas includes oxygen, or silicon hydride, or phosphorous, or fluorine, or nitrogen, or any combination thereof.

6. The device of claim 4 wherein inert gas includes argon.

7. The device of claim 6 wherein the first dielectric film is deposited in a reaction chamber and formed from a mixture of a dielectric material gas and an inert gas having a gas flow in between 5 and 150 sccm for each gas.

8. The device of claim 7 wherein the dielectric material gas includes oxygen, or silicon hydride, or phosphorous, or fluorine, or nitrogen, or any combination thereof.

9. The device of claim 7 wherein the inert gas includes argon.

10. An integrated circuit device, comprising:
an integrated circuit having metal lines and gaps between the metal lines that are as narrow as 0.2 μm; and
a final passivation layer having only a first dielectric film and a second dielectric film, the first dielectric film formed over said metal lines and gaps and formed of one among HDPCVD silicon dioxide, phosphorous-doped HDPCVD silicon oxide, fluorurate-doped HDPCVD silicon oxide, HDPCVD nitride and HDPCVD nitride oxide and having a deposition/sputtering ratio of about 2.5:1 to about 8.0:1 to the integrated circuit to completely fill
the gaps between the metal lines, and the second dielectric film deposited over all the surface of the first dielectric film and formed from one of either a Plasma Enhanced CVD film and an Atmospheric Pressure CVD film.

* * * * *

UNITED STATES PATENT AND TRADEMARK OFFICE
CERTIFICATE OF CORRECTION

PATENT NO. : 6,888,225 B2
DATED : May 3, 2005
INVENTOR(S) : Giorgio De Santi et al.

It is certified that error appears in the above-identified patent and that said Letters Patent is hereby corrected as shown below:

Title page,
Item [56], References Cited, please insert the following:
-- U.S. PATENT DOCUMENTS

| | | | |
|---|---|---|---|
| 4,892,753 | 01/09/90 | Wang et al. | 427/38 |
| 5,089,442 | 02/18/92 | Olmer | 432/235 |
| 5,260,236 | 11/09/93 | Petro et al. | 437/241 |
| 5,306,946 | 04/26/94 | Yamamoto | 257/640 |
| 5,317,185 | 05/31/94 | Fernandes et al. | 257/629 |
| 5,470,802 | 11/28/95 | Gnede et al. | 438/781 |
| 5,510,293 | 04/23/96 | Numata | 438/622 |
| 5,523,616 | 06/04/96 | Den | 257/637 |
| 5,563,104 | 10/08/96 | Jang et al. | 437/235 |
| 5,565,247 | 10/15/96 | Suzuki | 427/562 |

FOREIGN PATENT DOCUMENTS
EP    0 497 541 A1    08/05/92
EP    0 641 013 A2    03/01/95
OTHER PUBLICATIONS
Levim, R.M. et al., "The Step Coverage of Undoped and Phosphorus-Doped $SIO_2$ Glass Films," *J. Vac. Sci. Technol. B*, 1(1):54-61, 1983.
Shioya, Y. et al., "Comparison of Phosphosilicate Glass Films Deposited by Three Different Chemical Vapor Deposition Methods," *J. Electrochem. Soc.: Solid-State Science and Technology*, 133(9):1943-1950, 1986.
Rojas, S. et al., "Characterization of Silicon Dioxide and Phosphosilicate Glass Deposited Films," *J. Vac. Sci. Technol. B*, 11(6):2081-2089, 1993. --.

Column 4,
Line 13, "wherein inert gas" should read as -- wherein the inert gas --.

Signed and Sealed this

Eighth Day of November, 2005

JON W. DUDAS
*Director of the United States Patent and Trademark Office*